US008999624B2

(12) United States Patent
Chen et al.

(10) Patent No.: US 8,999,624 B2
(45) Date of Patent: Apr. 7, 2015

(54) DEVELOPABLE BOTTOM ANTIREFLECTIVE COATING COMPOSITION AND PATTERN FORMING METHOD USING THEREOF

(75) Inventors: Kuang-Jung Chen, Poughkeepsie, NY (US); Steven J. Holmes, Guilderland, NY (US); Wu-Song Huang, Brewster, NY (US); Ranee Kwong, Wappingers Falls, NY (US); Sen Liu, Piscataway, NJ (US)

(73) Assignee: International Business Machines Corporation, Armonk, NY (US)

( * ) Notice: Subject to any disclaimer, the term of this patent is extended or adjusted under 35 U.S.C. 154(b) by 219 days.

(21) Appl. No.: 13/537,177

(22) Filed: Jun. 29, 2012

(65) Prior Publication Data

US 2014/0004712 A1    Jan. 2, 2014

(51) Int. Cl.
| G03F 7/11 | (2006.01) |
| G03F 7/004 | (2006.01) |
| G03F 7/039 | (2006.01) |
| H01L 21/027 | (2006.01) |
| C08L 33/06 | (2006.01) |
| C08F 220/26 | (2006.01) |
| C08L 33/16 | (2006.01) |

(52) U.S. Cl.
CPC ............... G03F 7/11 (2013.01); G03F 7/0046 (2013.01); G03F 7/0397 (2013.01); H01L 21/0274 (2013.01); G03F 7/0392 (2013.01); C08L 33/066 (2013.01); C08F 220/26 (2013.01); C08L 33/16 (2013.01); H01L 21/0276 (2013.01); Y10S 430/114 (2013.01); Y10S 430/128 (2013.01)

(58) Field of Classification Search
CPC ......... G03F 7/11; G03F 7/0397; G03F 7/091; G03F 7/0045; G03F 7/0392; G03F 7/0046; G03F 7/095; H01I 21/0276; H01I 21/0274; C08L 33/066; C08L 33/16; C08F 220/36; C08F 220/40; C08F 220/16
USPC ............. 430/270.1, 271.1, 927, 913; 524/558
See application file for complete search history.

(56) References Cited

U.S. PATENT DOCUMENTS

| 5,585,222 A | 12/1996 | Kaimoto et al. | |
| 5,886,102 A * | 3/1999 | Sinta et al. | 525/154 |
| 6,242,161 B1 | 6/2001 | Kawaguchi et al. | |
| 6,677,106 B2 | 1/2004 | Blum et al. | |
| 6,733,935 B2 | 5/2004 | Kishimoto et al. | |
| 6,844,131 B2 | 1/2005 | Oberlander et al. | |
| 7,563,563 B2 | 7/2009 | Chen et al. | |
| 7,582,360 B2 * | 9/2009 | Wayton et al. | 428/480 |
| 7,824,837 B2 * | 11/2010 | Wu et al. | 430/270.1 |
| 7,906,270 B2 | 3/2011 | Paxton et al. | |
| 8,088,548 B2 * | 1/2012 | Houlihan et al. | 430/270.1 |
| 8,137,874 B2 * | 3/2012 | Goldfarb et al. | 430/14 |
| 8,182,978 B2 | 5/2012 | Huang et al. | |
| 8,455,176 B2 * | 6/2013 | Houlihan et al. | 430/288.1 |
| 8,715,907 B2 | 5/2014 | Chen et al. | |
| 2003/0129531 A1 | 7/2003 | Oberlander et al. | |
| 2003/0215736 A1 | 11/2003 | Oberlander et al. | |
| 2006/0063105 A1 | 3/2006 | Oberlander et al. | |
| 2006/0189146 A1 | 8/2006 | Oweyang et al. | |
| 2007/0003863 A1 | 1/2007 | Uh et al. | |
| 2007/0228365 A1 | 10/2007 | Jung | |
| 2007/0243484 A1 | 10/2007 | Chen et al. | |
| 2008/0090184 A1 | 4/2008 | Sui et al. | |
| 2008/0138744 A1 | 6/2008 | Hatanaka et al. | |
| 2008/0213707 A1 | 9/2008 | Brodsky et al. | |
| 2009/0098490 A1 | 4/2009 | Pham et al. | |
| 2009/0104559 A1 | 4/2009 | Houlihan et al. | |
| 2009/0162796 A1 | 6/2009 | Yun et al. | |
| 2009/0291392 A1 | 11/2009 | Chen et al. | |
| 2010/0119972 A1 | 5/2010 | Houlihan et al. | |
| 2010/0196825 A1 | 8/2010 | Huang et al. | |
| 2011/0076626 A1 * | 3/2011 | Padmanaban et al. | 430/326 |
| 2011/0300488 A1 | 12/2011 | Yao et al. | |

FOREIGN PATENT DOCUMENTS

| CA | 1204547 | 5/1986 |
| JP | 1-293339 | 10/1989 |
| WO | 2009/053832 A2 | 4/2009 |

OTHER PUBLICATIONS

U.S. Appl. No. 13/206,796, filed Aug. 10, 2011 Applicant: Kuang-Jung Chen, et al. Title: Developable Bottom Antireflective Coating Compositions for Negative Resists.
International Application No. PCT/US2013/048180 Filing Date: Jun. 27, 2013 International Search Report and Written Opinion.

* cited by examiner

Primary Examiner — Amanda C Walke
(74) Attorney, Agent, or Firm — Steven M. Kellner; Yuanmin Cai; Wenjie Li

(57) ABSTRACT

The present invention relates to a developable bottom antireflective coating (BARC) composition and a pattern forming method using the BARC composition. The BARC composition includes a first polymer having a first carboxylic acid moiety, a hydroxy-containing alicyclic moiety, and a first chromophore moiety; a second polymer having a second carboxylic acid moiety, a hydroxy-containing acyclic moiety, and a second chromophore moiety; a crosslinking agent; and a radiation sensitive acid generator. The first and second chromophore moieties each absorb light at a wavelength from 100 nm to 400 nm. In the patterning forming method, a photoresist layer is formed over a BARC layer of the BARC composition. After exposure, unexposed regions of the photoresist layer and the BARC layer are selectively removed by a developer to form a patterned structure in the photoresist layer. The BARC composition and the pattern forming method are especially useful for implanting levels.

13 Claims, No Drawings

DEVELOPABLE BOTTOM ANTIREFLECTIVE COATING COMPOSITION AND PATTERN FORMING METHOD USING THEREOF

FIELD OF THE INVENTION

This invention relates generally to antireflective coating (ARC) compositions, and more particularly to developable bottom antireflective coating (DBARC) compositions for using with an overlying photoresist. This invention is also directed to pattern forming methods of using such DBARC compositions.

BACKGROUND OF THE INVENTION

Photolithography is a process widely used in semiconductor industry to fabricate electronic devices which uses light to transfer a geometric pattern from a photomask to a substrate such as a silicon wafer. In a photolithography process, a photoresist layer is first formed on the substrate. The photoresist is exposed through a photomask with a desired pattern to a source of actinic radiation. The exposure causes a chemical reaction in the exposed areas of the photoresist and creates a latent image corresponding to the mask pattern in the photoresist layer. The photoresist is next developed in a developer, usually an aqueous base solution, to form a pattern in the photoresist layer. The patterned photoresist can then be used as a mask for subsequent fabrication processes on the substrate, such as deposition, etching, or ion implantation processes.

Two types of photoresist have been used in photolithography: positive resist and negative resist. A positive resist is initially insoluble in the developer. After exposure, the exposed region of the resist becomes soluble in the developer and is then selectively removed by the developer during the subsequent development step. A negative resist, on the other hand, is initially soluble in the developer. Exposure to radiation causes the exposed region of the resist to become insoluble in the developer. During the subsequent development step, the unexposed region of the negative resist is selectively removed by the developer, leaving the exposed region on the substrate to form a pattern.

In a photolithography process, exposure of the photoresist layer to the activation radiation is an important step in attaining a high resolution photoresist image. However, reflection of the activation radiation from the photoresist and the underlying substrate substantially limits the resolution of the process. Two major problems of the reflected radiation are: (1) thin film interference effects or standing waves, which are caused by variations in the total light intensity in the photoresist film as the photoresist thickness changes; and (2) reflective notching, which occurs when the photoresist is patterned over substrates containing topographical features.

The reflected radiation from the photoresist and the underlying substrate has become increasingly detrimental to the lithographic performance of the photoresist under high numerical aperture (NA) and short wavelength (such as 248 nm, 193 nm, and shorter wavelengths) exposure conditions. In implanting levels, the detrimental effect of the reflected radiation is even more pronounced due to the existence of surface topography generated after gate patterning and/or use of various reflective substrates, such as silicon, silicon nitride and silicon oxide, for advanced semiconductor devices.

Both top antireflective coatings (TARCs) and bottom antireflective coatings (BARCs) have been used in the industry to control the reflected radiation and to improve the lithographic image of the photoresist. The reflectivity control provided by a TARC layer is in general not as good as that obtained with a BARC layer. Using a BARC layer, however, generally requires an etch step to remove the BARC layer in order to transfer the resist pattern into the substrate. The etch step could cause resist thinning, wreck damages to the substrate, and affect the performance of the final device. The additional etch step to remove the BARC layer also increases cost and operational complexity in photolithography.

Recently, DBARC materials have been used to alleviate the reflectivity control issues with some success. DBARC materials are removable by the developer in the development step, eliminating the need of the additional etch step. However, most known DBARC materials in the art are compatible only with positive photoresists. The DBARC materials for positive photoresists become soluble to the developer upon radiation in the same manner as the positive photoresists.

Many implanting levels in semiconductor manufacturing employ negative photoresists because negative photoresists provide superior lithographic performance over topography and have less resist shrinkage during ion implantation compared with positive photoresists. Thus, there remains a need for a BARC composition that is developable in a developer, compatible with the overlying negative photoresist, and has desired optical properties so that it can be used as a BARC suitable especially for implanting levels.

SUMMARY OF THE INVENTION

The present invention provides a wet developable BARC composition. This invention also provides a pattern forming method using the BARC composition.

In one aspect, this invention provides a BARC composition which includes: a first polymer comprising a first carboxylic acid moiety, a hydroxy-containing alicyclic moiety, and a first chromophore moiety which absorbs light at a wavelength selected from a range from 100 nm to 400 nm; a second polymer comprising a second carboxylic acid moiety, a hydroxy-containing acyclic moiety, and a second chromophore moiety which absorbs light at a wavelength selected from a range from 100 nm to 400 nm; a crosslinking agent; and a radiation sensitive acid generator.

In another aspect, the present invention relates to a method of forming a patterned material structure on a substrate. The method includes the steps of: providing a substrate with a layer of the material; applying a BARC composition to the substrate to form a BARC layer over the material layer, the BARC composition comprising: a first polymer comprising a first carboxylic acid moiety, a hydroxy-containing alicyclic moiety, and a first chromophore moiety which absorbs light at a wavelength selected from a range from 100 nm to 400 nm; a second polymer comprising a second carboxylic acid moiety, a hydroxy-containing acyclic moiety, and a second chromophore moiety which absorbs light at a wavelength selected from a range from 100 nm to 400 nm; a crosslinking agent; and a radiation sensitive acid generator; forming a photoresist layer over the BARC layer; patternwise exposing the photoresist layer to radiation; and developing the substrate with a developer, whereby unexposed portions of the photoresist layer and the BARC layer are selectively removed by the developer to form a patterned structure in the photoresist layer.

The photoresist layer in the above method is preferably a negative photoresist.

The developer in the above method is preferably an aqueous alkaline developer.

The above method may further include a step of: transferring the patterned structure to the material layer. Preferably, the patterned structure is transferred by ion implantation to form a pattern of ion implanted material in the material layer.

The first carboxylic acid moiety and the second carboxylic acid moiety in the BARC composition are each independently selected from the group consisting of an acrylic acid monomer unit, a methacrylic acid monomer unit, a 4-vinylbenzoic acid monomer unit, a 2-carboxyethyl acrylate monomer unit, a 2-carboxyethyl methacrylate monomer unit, a mono-2-(methacryloyloxy)ethyl succinate monomer unit, and a mono-2-(acryloyloxy)ethyl succinate monomer unit.

The hydroxy-containing alicyclic moiety of the BARC composition preferably includes an adamantyl group. More preferably, the hydroxy-containing alicyclic moiety is a monomer unit derived from a monomer selected from the group consisting of the following structures:

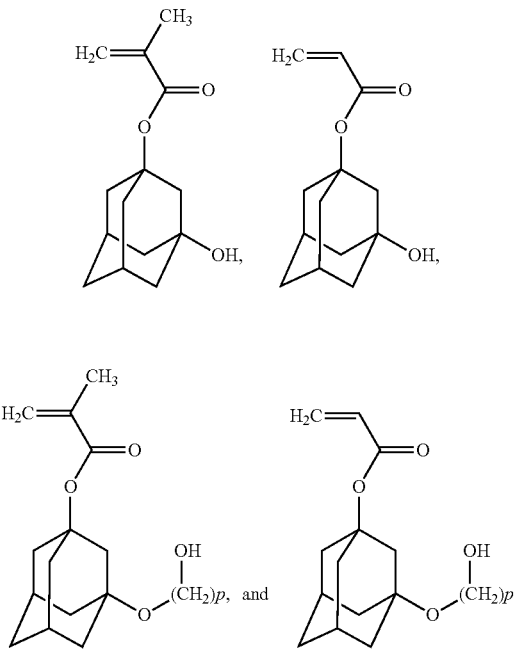

wherein p represents a positive integer from 1 to 30.

The hydroxy-containing acyclic moiety of the BARC composition is preferably a monomer unit derived from a monomer selected from the group consisting of the following structures:

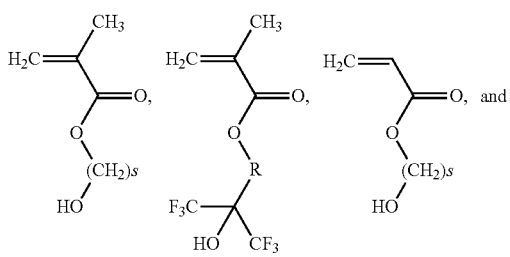

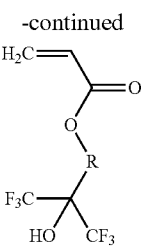

wherein s represents a positive integer from 1 to 30; R is a saturated carbon chain having a total number of carbon atoms from 1 to 30.

The first chromophore moiety and the second chromophore moiety of the BARC composition preferably each include an aromatic group. More preferably, the first chromophore moiety and the second chromophore moiety each independently is a monomer unit derived from a monomer selected from the group consisting of the following structures:

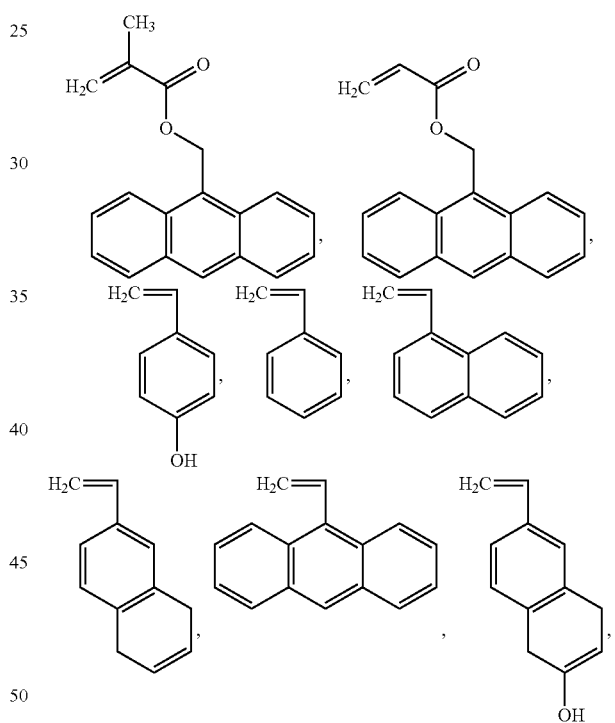

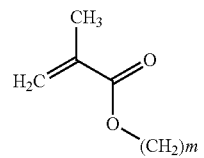

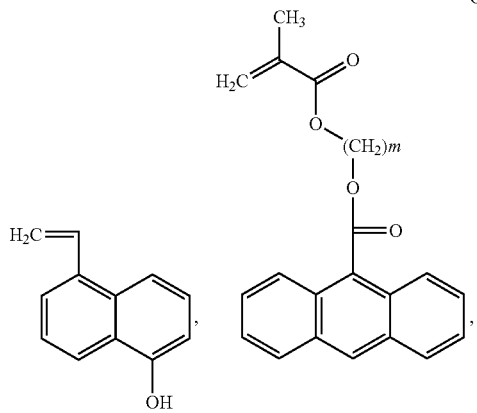

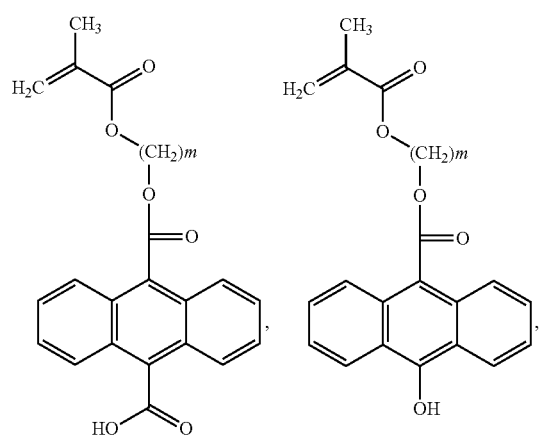
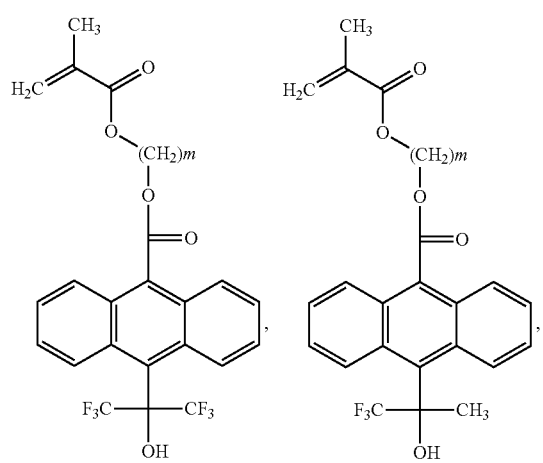
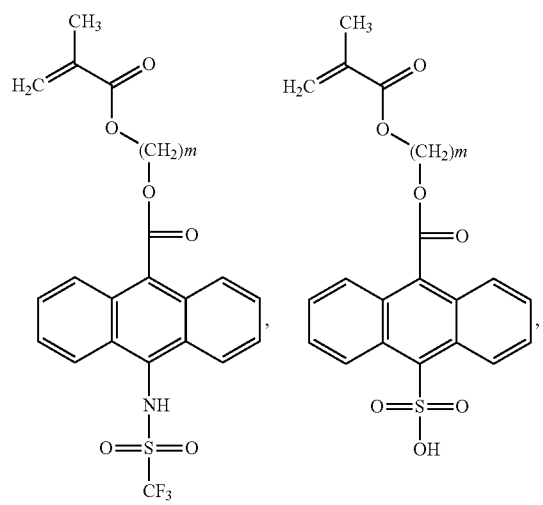
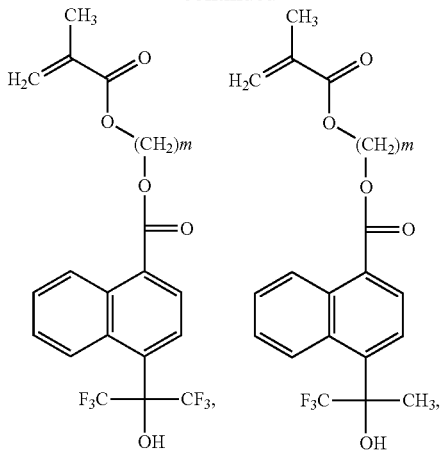
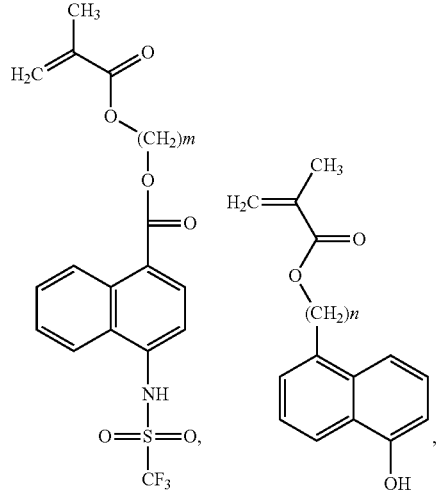
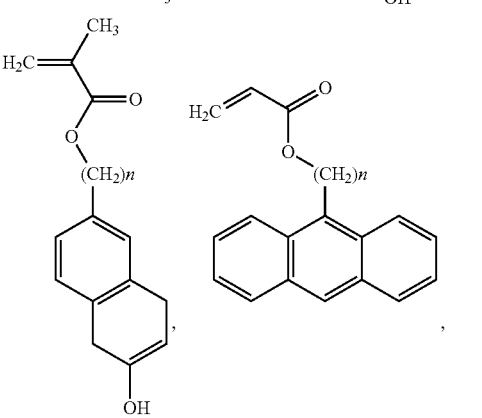
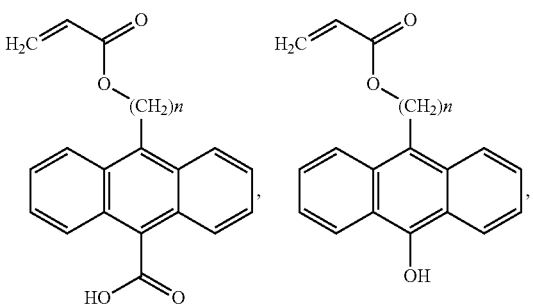

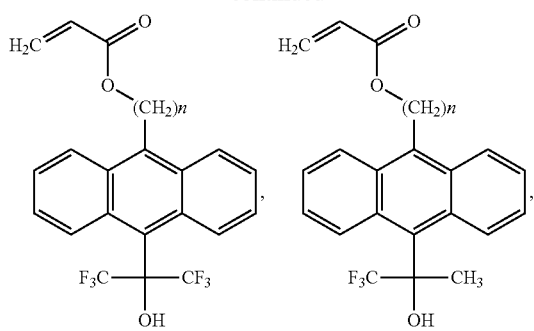
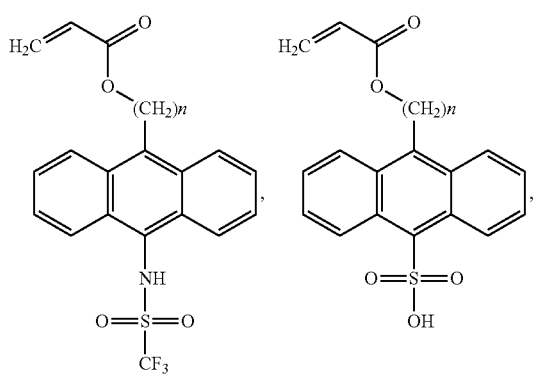
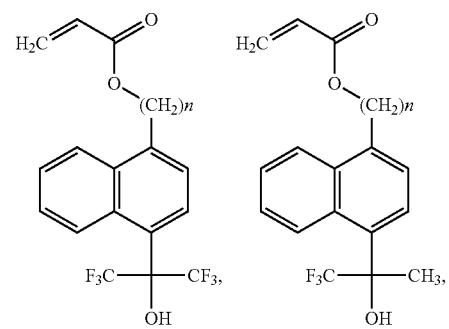
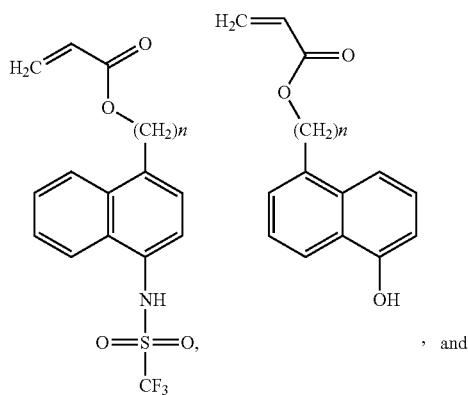

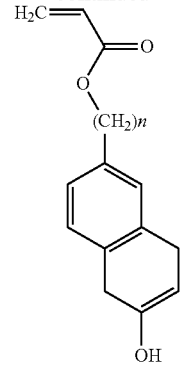

wherein m represents a positive integer from 1 to 30; n represents an integer from 0 to 30.

The crosslinking agent of the BARC composition is preferably a glycoluril compound.

The radiation sensitive acid generator of the BARC composition preferably includes at least one of an onium salt, a succinimide derivative, a diazo compound, and a nitrobenzyl compound.

The BARC composition may further includes at least one of a solvent, a quencher, and a surfactant. The solvent may be at least one of an ether, an alcohol, a glycol ether, an aromatic hydrocarbon, a ketone, and an ester. Preferably, the BARC composition includes: about 0.1 to about 29 wt. % of the first polymer; about 0.1 to about 29 wt. % of the second polymer; about 0.1 to about 30 wt. % of the crosslinking agent, based on the total weight of the first and second polymers; about 0.1 to about 30 wt. % of the radiation sensitive acid generator, based on the total weight of the first and second polymers; and about 70 to about 99.9 wt. % of the solvent. Preferably, the weight percentage of the first polymer is higher than the weight percentage of the second polymer.

DETAILED DESCRIPTION OF PREFERRED EMBODIMENTS

The terms "a" and "an" herein do not denote a limitation of quantity, but rather denote the presence of at least one of the referenced item.

"Optional" or "optionally" means that the subsequently described event or circumstance may or may not occur, and the description includes instances where the subsequently described event or circumstance occurs and instances where it does not.

When an element, such as a layer, is referred to as being "on" or "over" another element, it can be directly on the other element or intervening elements may also be present. In contrast, when an element is referred to as being "directly on" or "directly over" another element, there are no intervening elements present.

As stated above, the present invention is directed to a BARC composition for applying between a substrate and a photoresist layer to reduce or eliminate reflected radiation. The BARC composition is developable in a developer. A preferred example of the developer is an aqueous alkaline developer. More preferably, the developer is a tetramethyl ammonium hydroxide (TMAH) aqueous developer. The BARC composition is preferably negative working, i.e., unexposed portions of a BARC layer formed from the BARC composition are selectively removed by the developer in the development step while exposed portions of the BARC layer stay. Thus, the BARC composition of the present invention is compatible with negative photoresists and is suitable for lithographic levels where negative photoresists are used, such as implanting levels.

In one embodiment, the BARC composition includes a first polymer comprising a first carboxylic acid moiety, a hydroxy-containing alicyclic moiety, and a first chromophore moiety which absorbs light at a wavelength selected from a range from 100 nm to 400 nm; a second polymer comprising a second carboxylic acid moiety, a hydroxy-containing acyclic moiety, and a second chromophore moiety which absorbs light at a wavelength selected from a range from 100 nm to 400 nm; a crosslinking agent; and a radiation sensitive acid generator.

In the BARC composition, the first carboxylic acid moiety and the second carboxylic acid moiety provide developer solubility in an aqueous alkaline developer. The first carboxylic acid moiety and the second carboxylic acid moiety may have the same structure or different structures. An example of the first and second carboxylic acid moieties is a monomer unit of a polymer which contains a carboxylic acid group. The monomer unit may contain more than one carboxylic acid group. Examples of monomers from which the first carboxylic acid moiety and the second carboxylic acid moiety may derive include, but are not limited to: acrylic acid (1), a methacrylic (2), 4-vinylbenzoic acid (3), 2-carboxyethyl acrylate (4), 2-carboxyethyl methacrylate (5), mono-2-(methacryloyloxy)ethyl succinate (6), and mono-2-(acryloyloxy)ethyl succinate (7).

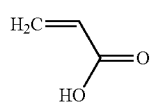

(1)

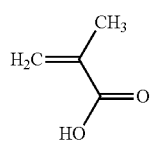

(2)

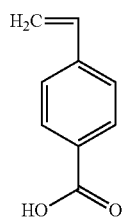

(3)

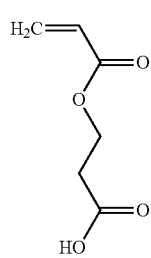

(4)

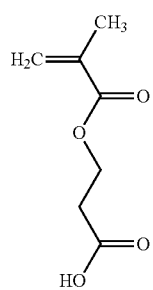

(5)

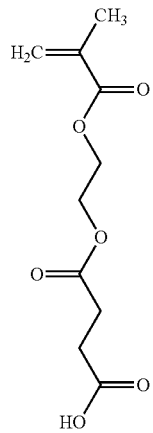

(6)

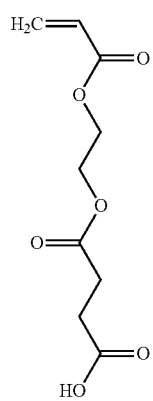

(7)

The hydroxy-containing alicyclic moiety of the first polymer in the BARC composition may be derived from a monomer containing both a hydroxy group and an alicyclic group. The hydroxy group may be connected directly to the alicyclic group. Alternatively, there may be an intervening group between the hydroxy and alicyclic groups. Examples of such an intervening group include an alkyl group and an alkoxy group. The hydroxy-containing alicyclic moiety may contain more than one hydroxy group.

The alicyclic group of the hydroxy-containing alicyclic moiety may be a monocyclic group or a polycyclic group. Preferably, the alicyclic group is a polycyclic group such as an adamantyl group. Examples of monomers from which the hydroxy-containing alicyclic moiety may derive include, but are not limited to: 3-hydroxy-1-adamantylmethacrylate (8), 3-(2'-hydroxyethoxy)-1-adamantylmethacrylate (9), 3-hydroxy-1-adamantylacrylate (10), 3-(2'-hydroxyethoxy)-1-adamantylacrylate (11), and other monomers with chemical structures (12) and (13).

(8)
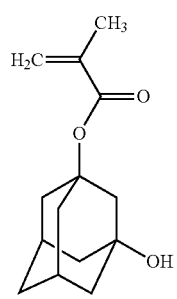

(9)
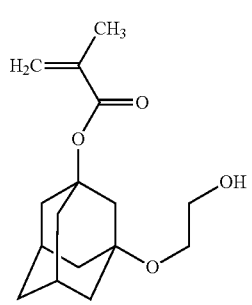

(10)
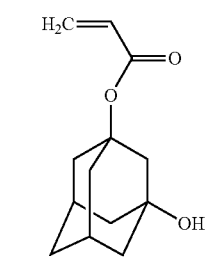

(11)
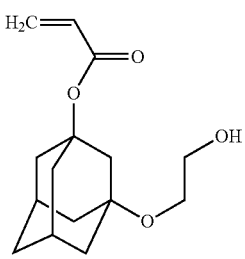

(12)
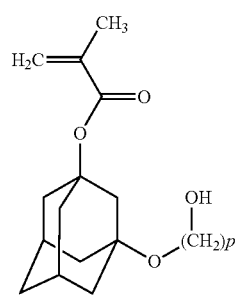

(13)
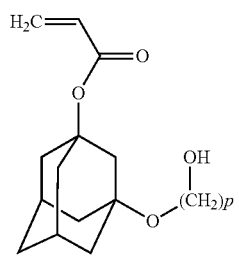

wherein the symbol p represents a positive integer having a value from 1 to 30 except 2.

The hydroxy-containing acyclic moiety of the second polymer in the BARC composition preferably does not contain any cyclic structure. Preferably, the hydroxy-containing acyclic moiety is a hydroxyalkylmethacrylate monomer unit or a hydroxyalkylacrylate monomer unit. Examples of monomers from which the hydroxy-containing acyclic moiety may derive include, but are not limited to: 2-hydroxyethylmethacrylate (14), 2-hydroxyethylacrylate (15), and other monomers with chemical structures (16)-(19).

(14)
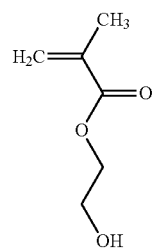

(15)
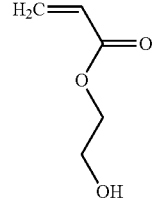

(16)
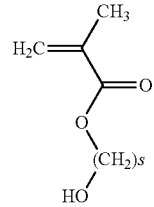

(17)
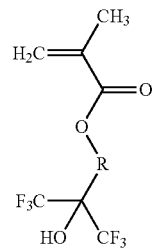

-continued

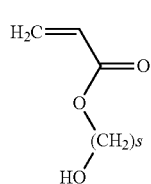
(18)

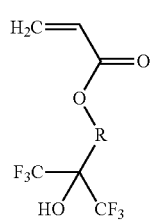
(19)

wherein the symbol s represents a positive integer having a value from 1 to 30 except 2; the symbol R represents a saturated carbon chain having a total number of carbon atoms from 1 to 30.

The first chromophore moiety and the second chromophore moiety are necessary to provide sufficient absorption coefficient k for the BARC composition. Typical target values for the absorption coefficient k of the BARC composition are from 0.01 to 2.0 at the wavelength of radiation for the overlying photoresist layer. More preferably, the absorption coefficient k of the BARC composition is from 0.01 to 1.0 at the wavelength of radiation for the overlying photoresist layer.

The choice for the first chromophore moiety and the second chromophore moiety depends on the exposure wavelength for the overlying photoresist layer. For exposure wavelengths of 248 nm and 193 nm, the first chromophore moiety and the second chromophore moiety preferably each includes an aromatic group. The first chromophore moiety and the second chromophore moiety may have the same structure or different structures. Examples of monomers from which the first chromophore moiety and the second chromophore moiety may derive include, but are not limited to: 9-anthrylmethylmethacrylate (20), 9-anthrylmethylacrylate (21), 4-hydroxy styrene (22), styrene (23), and other monomers with the following chemical structures (24)-(52):

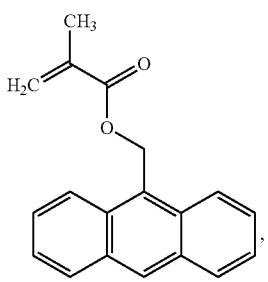
(20)

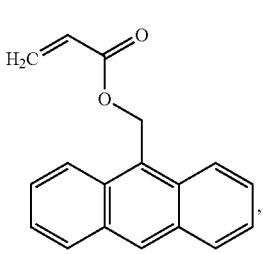
(21)

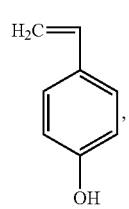
(22)

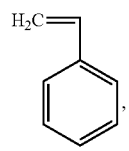
(23)

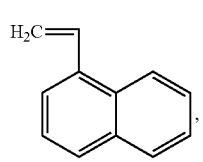
(24)

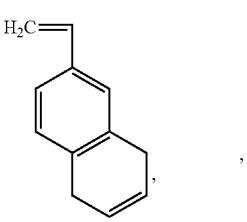
(25)

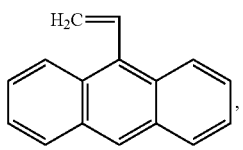
(26)

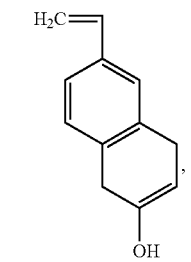
(27)

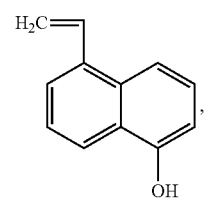
(28)

(29)
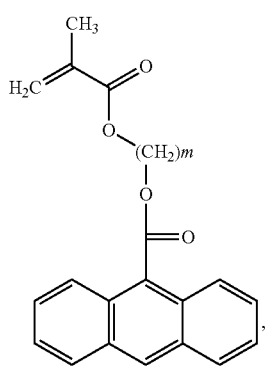
(30)
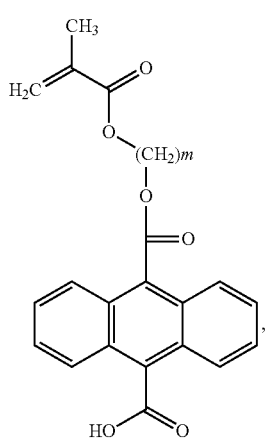
(31)
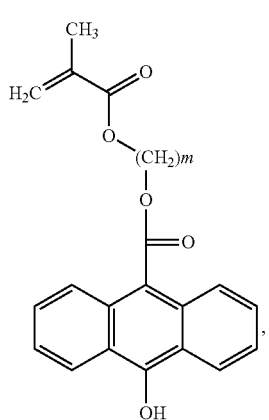
(32)
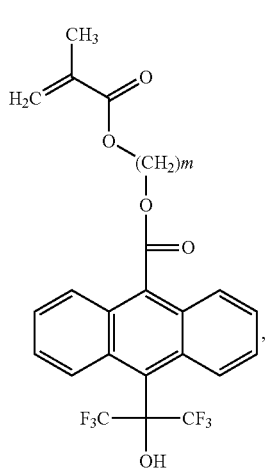
(33)
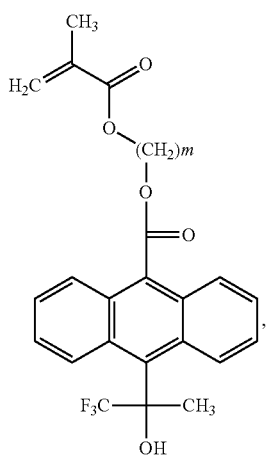
(34)
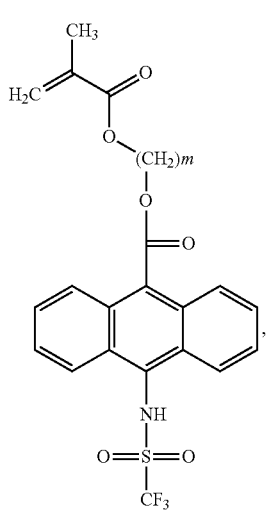
(35)
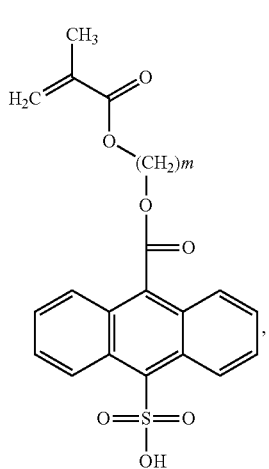

-continued
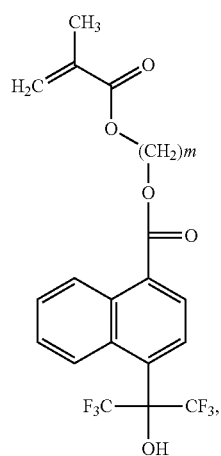
(36)
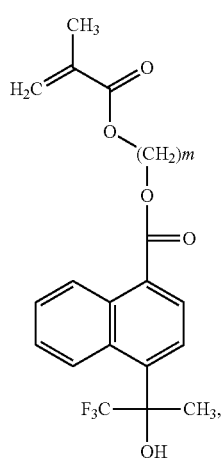
(37)
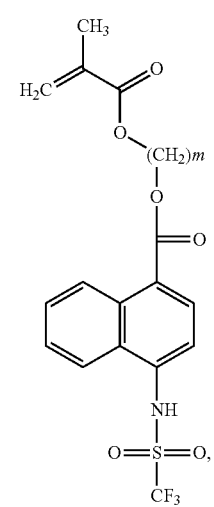
(38)
-continued
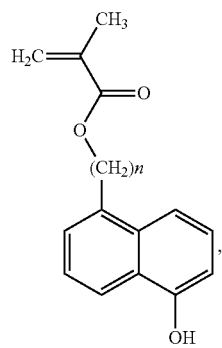
(39)
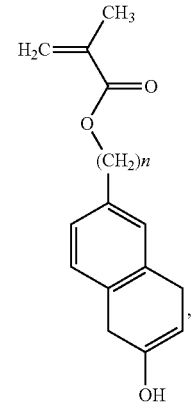
(40)
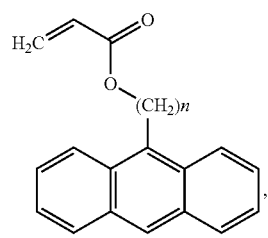
(41)
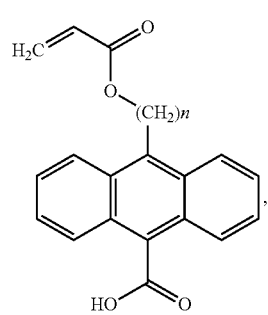
(42)
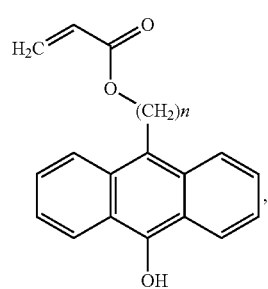
(43)

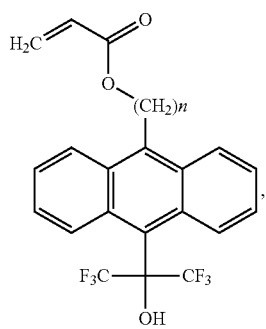 (44)
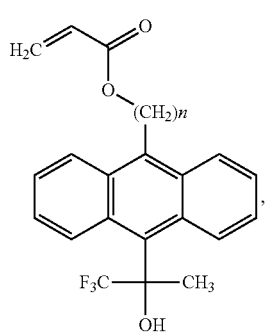 (45)
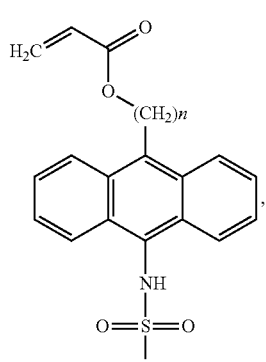 (46)
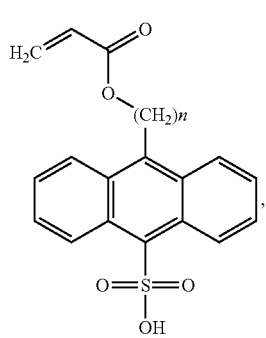 (47)
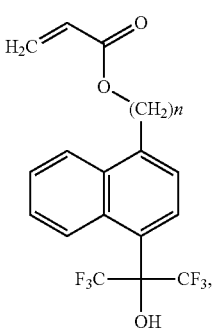 (48)
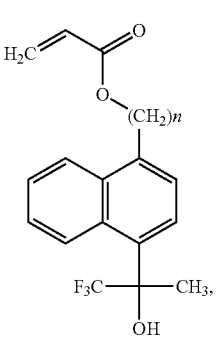 (49)
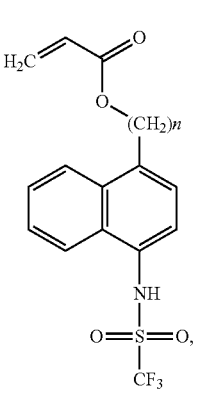 (50)
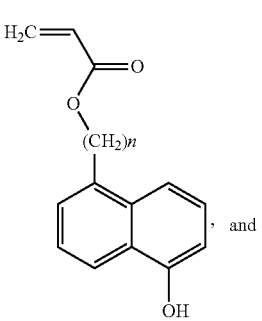 (51)
and

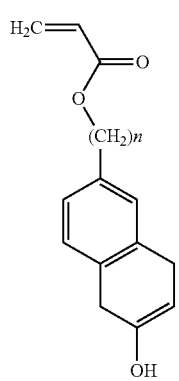

(52)

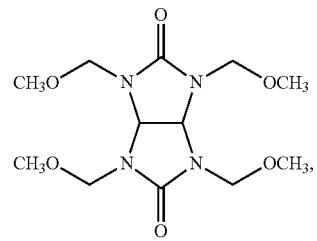

(53)

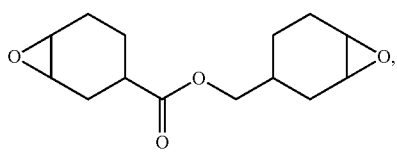

(54)

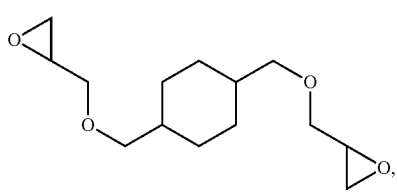

(55)

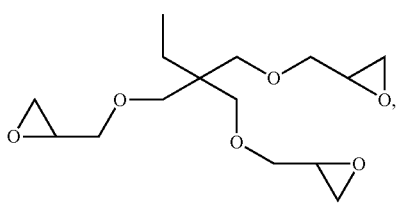

(56)

wherein the symbol m represents a positive integer from 1 to 30; the symbol n represents an integer from 0 to 30.

The first polymer of the BARC composition may contain from 20 mol % to 70 mol % of the first carboxylic acid moiety, from 20 mol % to 70 mol % of the hydroxy-containing alicyclic moiety, and from 5 mol % to 50 mol % of the first chromophore moiety. The second polymer of the BARC composition may contain from 20 mol % to 70 mol % of the second carboxylic acid moiety, from 20 mol % to 70 mol % of the hydroxy-containing acyclic moiety, and from 5 mol % to 50 mol % of the second chromophore moiety.

The BARC composition also includes a crosslinking agent. In the exposed regions, the crosslinking agent can react with the hydroxy groups of the first and second polymers in a manner which is catalyzed by acid and/or by heating to interlink or crosslink the polymer chains. The crosslinking of the polymer chains reduces the solubility of the exposed regions in the developer and creates the solubility difference in the developer between the exposed and unexposed regions of the BARC layer.

Generally, the crosslinking agent of the BARC composition of the present invention is any suitable crosslinking agent known in the negative photoresist art which is compatible with the other selected components of the BARC composition. The crosslinking agent typically acts to crosslink the first and second polymers in the presence of a generated acid. Typical crosslinking agents are glycoluril compounds such as tetramethoxymethyl glycoluril, methylpropyltetramethoxymethyl glycoluril, and methylphenyltetramethoxymethyl glycoluril, available under the POWDER-LINK® trademark from Cytec Industries. Other possible crosslinking agents include: 2,6-bis(hydroxymethyl)-p-cresol compounds such as those disclosed in Japanese Laid-Open Patent Application (Kokai) No. 1-293339, etherified amino resins, for example, methylated or butylated melamine resins (N-methoxymethyl- or N-butoxymethyl-melamine respectively), and methylated/butylated glycolurils, for example as disclosed in Canadian Patent No. 1 204 547. Other crosslinking agents such as bis-epoxies or bis-phenols (e.g., bisphenol-A) may also be used. Combinations of two or more crosslinking agents may be preferred in some embodiments.

Some particular examples of crosslinking agents suitable for use in the BARC composition according to the present invention include, but are not limited to:

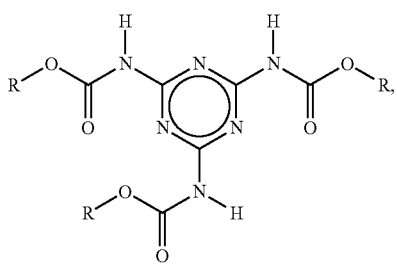

(57)

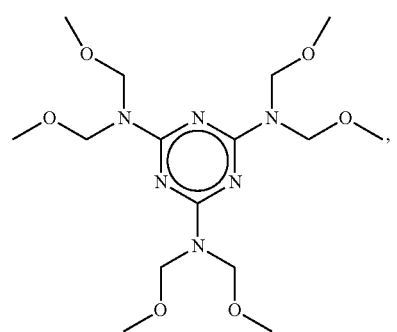

(58)

-continued
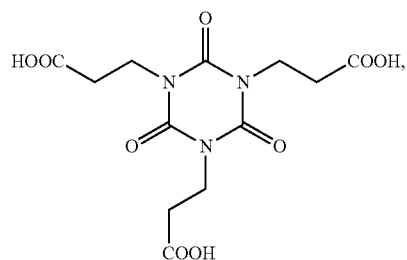
(59)
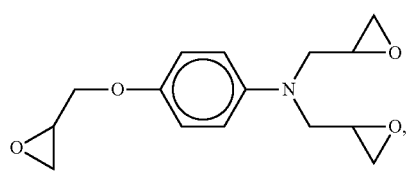
(60)
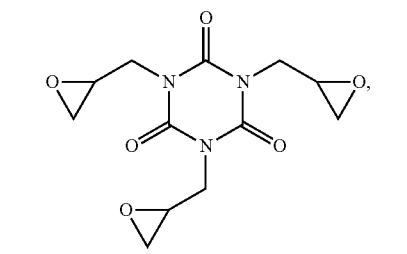
(61)
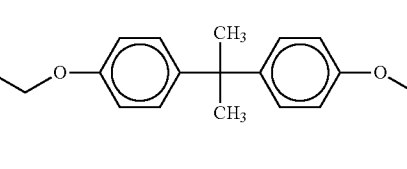
(62)
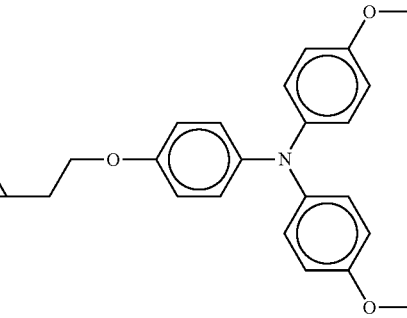
(63)
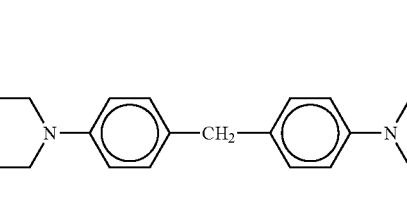
(64)
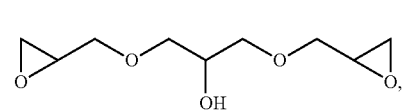
(65)
-continued
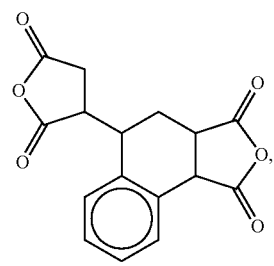
(66)
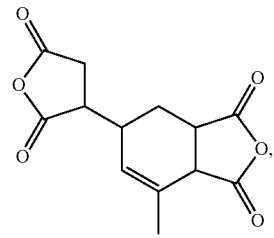
(67)
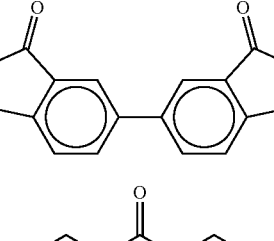
(68)
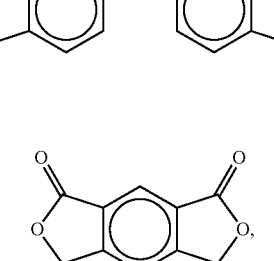
(69)
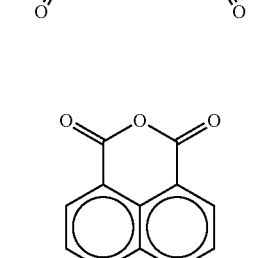
(70)
(71)
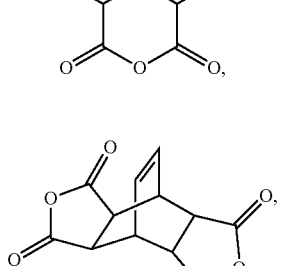
(72)

-continued

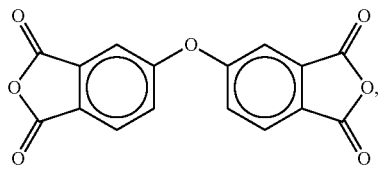
(73)

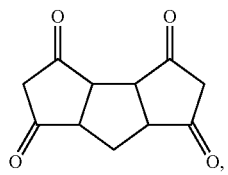
(74)

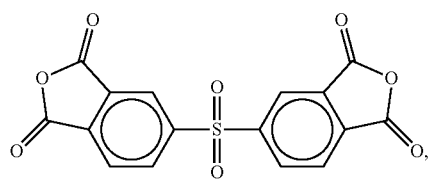
(75)

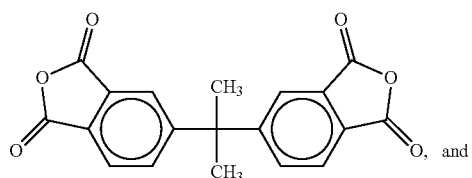
(76)

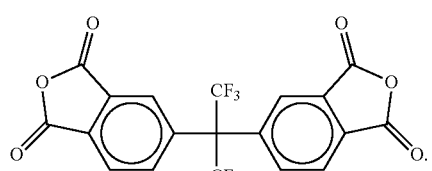
(77)

The BARC composition of the present invention also includes a radiation sensitive acid generator. The radiation sensitive acid generator, also known as photoacid generator (PAG), is a compound that generates an acid upon exposure to radiation. The PAG of the present invention may be one of an onium salt, a succinimide derivative, a diazo compound, a nitrobenzyl compound, and the like. To minimize acid diffusion for high resolution capability, the PAGs may be such that they generate bulky acids upon exposure to radiation. Such bulky acids may include at least 4 carbon atoms.

A preferred PAG that may be employed in the present invention is an onium salt, such as an iodonium salt or a sulfonium salt, and/or a succinimide derivative. In various exemplary embodiments of the present invention, the preferred PAG may include 4-(1-butoxynaphthyl)tetrahydrothiophenium perfluorobutanesulfonate, triphenyl sulfonium perfluorobutanesulfonate, t-butylphenyl diphenyl sulfonium perfluorobutanesulfonate, 4-(1-butoxynaphthyl) tetrahydrothiophenium perfluorooctanesulfonate, triphenyl sulfonium perfluorooctanesulfonate, t-butylphenyl diphenyl sulfonium perfluorooctanesulfonate, di(t-butylphenyl) iodonium perfluorobutane sulfonate, di(t-butylphenyl) iodonium perfluorohexane sulfonate, di(t-butylphenyl) iodonium perfluoroethylcyclohexane sulfonate, di(t-buylphenyl)iodonium camphoresulfonate, and perfluorobutylsulfonyloxybicylo[2.2.1]-hept-5-ene-2,3-dicarboximide. Any of these PAGs may be used singly or in a mixture of two or more. Both fluorinated and fluorine-free PAGs can be used in the present invention.

The specific PAG selected will depend on the radiation being used for patterning the overlying photoresist layer. PAGs are currently available for a variety of different wavelengths of light from the visible range to the extreme UV range. Preferably, the PAG is one suitable for use in 248 nm (KrF) and 193 nm (ArF) lithography.

The BARC composition of the present invention may further include a solvent, and other performance enhancing additives, for example, a quencher and a surfactant. The solvent is used to dissolve the first and second polymers and other components of the BARC composition. Examples of suitable solvents include, but are not limited to: ethers, glycol ethers, alcohol, aromatic hydrocarbons, ketones, esters and the like. Suitable glycol ethers include: 2-methoxyethyl ether (diglyme), ethylene glycol monomethyl ether, propylene glycol monomethyl ether (PGME), propylene glycol monomethyl-ether acetate (PGMEA), propylene glycol monoethyl ether (PGEE) and the like. Suitable alcohols include: 3-methoxy-1-butanol, and 1-methoxy-2-butanol. Suitable aromatic hydrocarbon solvents include: toluene, xylene, and benzene. Examples of ketones include: methylisobutylketone, 2-heptanone, cycloheptanone, gamma-butyrolactone (GBL), and cyclohexanone. An example of an ether solvent is tetrahydrofuran, whereas ethyl lactate and ethoxy ethyl propionate are examples of ester solvents that may be employed in the present invention. A solvent system including a mixture of the aforementioned solvents is also contemplated. Examples of mixed solvents may include PGMEA and GBL, with the wt. % of one solvent in the total weight of the solvent mixture from about 1 to about 99 wt. %.

The quencher that may be used in the BARC composition of the present invention may comprise a weak base that scavenges trace acids, while not having an excessive impact on the performance of the BARC. Illustrative examples of quenchers that can be employed in the present invention include, but are not limited to: aliphatic amines, aromatic amines, carboxylates, hydroxides, or combinations thereof and the like.

The optional surfactants that can be employed in the BARC compositions include any surfactant that is capable of improving the coating homogeneity of the BARC composition of the present invention. Illustrative examples include: fluorine-containing surfactants such as 3M's FC-4430® and siloxane-containing surfactants such as Union Carbide's Silwet® series.

The weight percentage of the first polymer in the BARC composition is preferably higher than the weight percentage of the second polymer. In various exemplary embodiments of the present invention, the BARC composition may include: about 0.1 to about 29 wt. % of the first polymer, more preferably about 0.2 to about 15 wt. %; about 0.1 to about 29 wt. % of the second polymer, more preferably about 0.2 to about 15 wt. %; about 0.1 to about 30 wt. % of the crosslinking agent, based on the total weight of the first and second polymers, more preferably about 0.5 to about 10 wt. %; about 0.1 to about 30 wt. % of the radiation sensitive acid generator, based on the total weight of the first and second polymers, more preferably about 0.5 to about 10 wt. %; and about 70 to about 99.9 wt. % of the solvent, more preferably about 90 to about 99.9 wt. %.

In various exemplary embodiments, the BARC composition may further comprise a quencher, which may typically be present in amounts of about 0.01 to about 10.0 wt. % based on the total weight of the first and second polymers, and a surfactant, which may typically be present in amounts of about 0.001 to about 1.0 wt. %, based on the total weight of the first and second polymers.

Note that the amounts given above are exemplary and that other amounts of each of the above components, which are typically employed in the photolithography industry, can also be employed herein.

The present invention also encompasses a method of using the BARC composition described above to form patterned material features on a substrate. In one embodiment, such a method includes the steps of: providing a substrate with a layer of the material; applying a BARC composition to the substrate to form a BARC layer over the material layer, the BARC composition comprising: a first polymer comprising a first carboxylic acid moiety, a hydroxy-containing alicyclic moiety, and a first chromophore moiety which absorbs light at a wavelength selected from a range from 100 nm to 400 nm; a second polymer comprising a second carboxylic acid moiety, a hydroxy-containing acyclic moiety, and a second chromophore moiety which absorbs light at a wavelength selected from a range from 100 nm to 400 nm; a crosslinking agent; and a radiation sensitive acid generator; forming a photoresist layer over the BARC layer; patternwise exposing the photoresist layer to radiation; and developing the substrate with a developer, whereby unexposed portions of the photoresist layer and the BARC layer are selectively removed by the developer to form a patterned structure in the photoresist layer.

The substrate is suitably any substrate conventionally used in processes involving photoresists. For example, the substrate can be silicon, silicon oxide, aluminum-aluminum oxide, gallium arsenide, ceramic, quartz, copper or any combination thereof, including multilayers. The substrate can include one or more semiconductor layers or structures and can include active or operable portions of semiconductor devices.

The material layer may be a metal conductor layer, a ceramic insulator layer, a semiconductor layer or other material depending on the stage of the manufacture process and the desired material set for the end product. The BARC compositions of the invention are especially useful for lithographic processes used in the manufacture of integrated circuits on semiconductor substrates. The BARC compositions of the invention can be used in lithographic processes to create patterned material layer structures such as metal wiring lines, holes for contacts or vias, insulation sections (e.g., damascene trenches or shallow trench isolation), trenches for capacitor structures, ion implanted semiconductor structures for transistors, etc. as might be used in integrated circuit devices.

The BARC layer may be formed by virtually any standard means including spin coating. The BARC layer may be baked to remove any solvent from the BARC and improve the coherence of the BARC layer. The preferred range of the baking temperature for the BARC layer is from about 70° C. to about 150° C., more preferably from about 90° C. to about 130° C. The preferred range of thickness of the BARC layer is from about 5 nm to about 150 nm, more preferably from about 10 nm to about 100 nm.

The BARC layer is preferably insoluble in a typical resist solvent such as propylene glycol monomethylether acetate (PGMEA) after coating and baking The insolubility makes it possible to apply a photoresist layer over the BARC layer without intermixing these two layers.

A photoresist layer is then formed over the BARC layer. The photoresist layer is preferably a negative photoresist such as NSD2803Y and KEFK3034, which are commercially available from JSR Corporation. The photoresist layer may be formed by virtually any standard means including spin coating. The photoresist layer may be baked (post applying bake (PAB)) to remove any solvent from the photoresist and improve the coherence of the photoresist layer. The preferred range of the PAB temperature for the photoresist layer is from about 70° C. to about 150° C., more preferably from about 90° C. to about 130° C. The preferred range of thickness of the photoresist layer is from about 20 nm to about 400 nm, more preferably from about 30 nm to about 300 nm.

In some cases, a top antireflective coating layer may be applied over the photoresist layer to further reduce or eliminate reflected radiation.

The photoresist layer is then patternwise exposed to the desired radiation. The radiation employed in the present invention can be visible light, ultraviolet (UV), extreme ultraviolet (EUV) and electron beam (E-beam). It is preferred that the imaging wavelength of the radiation is about 248 nm, 193 nm or 13 nm. It is more preferred that the imaging wavelength of the radiation is about 248 nm. The patternwise exposure is conducted through a mask which is placed over the photoresist layer.

After the desired patternwise exposure, the photoresist layer is typically baked (post exposure bake (PEB)) to further complete the acid-catalyzed reaction and to enhance the contrast of the exposed pattern. The preferred range of the PEB temperature is from about 70° C. to about 150° C., more preferably from about 90° C. to about 130° C. In some instances, it is possible to avoid the PEB step since for certain chemistries, such as acetal and ketal chemistries, deprotection of the resist polymer proceeds at room temperature. The post-exposure bake is preferably conducted for about 30 seconds to 5 minutes.

After PEB, if any, the photoresist layer with the desired pattern is obtained (developed) by contacting the photoresist layer with a developer. A preferred example of the developer is an aqueous alkaline developer. More preferably, the developer is a tetramethyl ammonium hydroxide (TMAH) aqueous developer. An example of the TMAH aqueous developer is 0.26 N TMAH developer. The developer selectively dissolves unexposed portions of the photoresist layer and the BARC layer to form a patterned structure in the photoresist layer. Hence, the development step in the present invention is a "negative development" step. The wet removal of the unexposed portions of the BARC layer eliminate the need of an additional etch step.

The pattern from the photoresist layer may then be transferred to the exposed portions of underlying material layer of the substrate using techniques known in the art. Preferably, the pattern is transferred by ion implantation to form a pattern of ion implanted material. Alternatively, the transfer may be done by etch methods such as reactive ion etching or wet etching. Once the desired pattern transfer has taken place, any remaining photoresist layer and/or BARC layer may be removed using conventional stripping techniques.

Examples of general lithographic processes where the composition of the invention may be useful are disclosed in U.S. Pat. Nos. 4,855,017; 5,362,663; 5,429,710; 5,562,801; 5,618,751; 5,744,376; 5,801,094; 5,821,469 and 5,948,570. Other examples of pattern transfer processes are described in Chapters 12 and 13 of "Semiconductor Lithography, Principles, Practices, and Materials" by Wayne Moreau, Plenum Press, (1988). It should be understood that the invention is not limited to any specific lithography technique or device structure.

The invention is further described by the examples below. The invention is not limited to the specific details of the examples.

EXAMPLE 1

Synthesis of MAA/HADMA/ANTMA (P1)

To a mixture of methacrylic acid (0.775 g, 9 mmol), 3-hydroxy-1 adamantylmethacrylate (1.42 g, 6 mmol), 9-anthrylmethylmethacrylate (1.38 g, 5 mmol) in 20 mL of tetrahydrofuran (THF) was added 2,2'-azobis(2-methylpropionitrile (0.24 g, 1.5 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 3.1 gram of P1 as white solid.

EXAMPLE 2

Synthesis of MAA/HEMA/ANTMA (P2)

To a mixture of methacrylic acid (0.775 g, 9 mmol), 2-hydroxyethylmethacrylate (0.78 g, 6 mmol), 9-anthrylmethylmethacrylate (1.38 g, 5 mmol) in 20 mL of THF was added 2,2'-azobis(2-methylpropionitrile (0.24 g, 1.5 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 2.5 gram of P2 as white solid.

EXAMPLE 3

Synthesis of MAA/HEADMA/ANTMA (P3)

To a mixture of methacrylic acid (0.775 g, 9 mmol), 3-(2'-hydroxyethoxy)-1-adamantylmethacrylate (1.68 g, 6 mmol), 9-anthrylmethylmethacrylate (1.38 g, 5 mmol) in 20 mL of THF was added 2,2'-azobis(2-methylpropionitrile (0.24 g, 1.5 mmol). The resulting solution was purged by nitrogen for 30 minutes before it was heats to 72° C. for 18 hours under nitrogen. The solution was then cooled to room temperature and added drop-wise into 400 mL of de-ionized water. The solid was filtered with a frit funnel, washed with water (2×200 ml) and dried in a vacuum oven at 50° C. for 24 hours to afford 3.5 gram of P3 as white solid.

EXAMPLE 4

Developable BARC formulation (F1)

1.0502 gram of the terpolymer (P1) solid consisting of 45 mole % (molar percentage) of methacrylic acid, 30 mole % of 3-hydroxy-1 adamantylmethacrylate and 25 mole % of 9-anthrylmethylmethacrylate, 12.8573 gram of 3.5 wt % solution of the terpolymer (P2) consisting of 45 mole % of methacrylic acid, 30 mole % of 2-hydroxyethylmethacrylate and 25 mole % of 9-anthrylmethylmethacrylate in 3-methoxy-1-butanol, 0.0751 gram of triphenyl sulfonium trifluoromethanesulfonate, 1.0726 gram of 1 wt % solution of 1-tert-butyloxycarbonyl-2-phenylbenzimidazole in propylene glycol methyl ether acetate (PGMEA), 3.0106 gram of 1 wt % of tetramethoxymethyl glycoluril in 3-methoxy-1-butanol, and 3.6729 gram of 1 wt % solution of a perfluoroalkyl surfactant in PGMEA were dissolved in 55.4119 gram of 3-methoxy-1-butanol to make a developable BARC solution (F1). The resulting developable BARC solution was filtered through a 0.2 μm PTFE filter disc.

EXAMPLE 5

Developable BARC formulation (F2)

1.0504 gram of the terpolymer (P3) solid consisting of 45 mole % of methacrylic acid, 30 mole % of 3-(2'-hydroxyethoxy)-1-adamantylmethacrylate and 25 mole % of 9-anthrylmethylmethacrylate, 12.8582 gram of 3.5 wt % solution of the terpolymer (P2) consisting of 45 mole % of methacrylic acid, 30 mole % of 2-hydroxyethylmethacrylate and 25 mole % of 9-anthrylmethylmethacrylate in 3-methoxy-1-butanol, 0.075 gram of triphenyl sulfonium trifluoromethanesulfonate, 1.0691 gram of 1 wt % solution of 1-tert-butyloxycarbonyl-2-phenylbenzimidazole in PGMEA, 3.0001 gram of 1 wt % of tetramethoxymethyl glycoluril in 3-methoxy-1-butanol, and 3.6720 gram of 1 wt % solution of a perfluoroalkyl surfactant in PGMEA were dissolved in 55.3893 gram of 3-methoxy-1-butanol to make a developable BARC solution (F2). The resulting developable BARC solution was filtered through a 0.2 μm PTFE filter disc.

EXAMPLE 6

Lithography Evaluation

To evaluate the lithographic performance of the resulting developable BARC under 248 nm radiation, the filtered developable BARC formulations F1 or F2 was spin-coated for 60 seconds on a 12 inch silicon wafer at a spin speed of 1500 rpm. The film was baked at 120° C. for 60 seconds to afford a film thickness of 60 nm. A 248 nm negative resist KEFK3034 from JSR was spin-coated for 60 seconds onto such a developable BARC layer at a spin speed of 1500 rpm to afford a resist film with a thickness of 250 nm, the resulting developable BARC/resist stack was baked at 90° C. and exposed to 248 nm radiation (ASML scanner). The exposure pattern was an array of lines and spaces of various dimensions. The exposed wafer was post-exposure baked at 110° C. for 60 seconds, followed by a 0.26 N TMAH developer puddle for 30 seconds. The resulting patterns of the developable BARC/negative resist stack were examined by a scanning electron microscopy (SEM). Under such a lithography condition, a line/space (470 nm/210 nm) pattern and a line/space (265 nm/165 nm) pattern were obtained.

While the present invention has been particularly shown and described with respect to preferred embodiments, it will be understood by those skilled in the art that the foregoing and other changes in forms and details may be made without departing from the spirit and scope of the invention. It is therefore intended that the present invention not be limited to the exact forms and details described and illustrated but fall within the scope of the appended claims.

What is claimed is:

1. A bottom antireflective coating (BARC) composition comprising:
   a first polymer comprising a first carboxylic acid moiety, a hydroxy-containing alicyclic moiety, and a first chromophore moiety which absorbs light at a wavelength selected from a range from 100 nm to 400 nm;
   a second polymer comprising a second carboxylic acid moiety, a hydroxy-containing acyclic moiety, and a second chromophore moiety which absorbs light at a wavelength selected from a range from 100 nm to 400 nm;

a crosslinking agent joining the first polymer and the second polymer; and a radiation sensitive acid generator.

2. The BARC composition of claim 1, wherein the first carboxylic acid moiety and the second carboxylic acid moiety are each independently selected from the group consisting of: an acrylic acid monomer unit, a methacrylic acid monomer unit, a 4-vinylbenzoic acid monomer unit, a 2-carboxyethyl acrylate monomer unit, a 2-carboxyethyl methacrylate monomer unit, a mono-2-(methacryloyloxy)ethyl succinate monomer unit, and a mono-2-(acryloyloxy)ethyl succinate monomer unit.

3. The BARC composition of claim 1, wherein the hydroxy-containing alicyclic moiety includes an adamantyl group.

4. The BARC composition of claim 3, wherein the hydroxy-containing alicyclic moiety is a monomer unit derived from a monomer selected from the group consisting of the following structures:

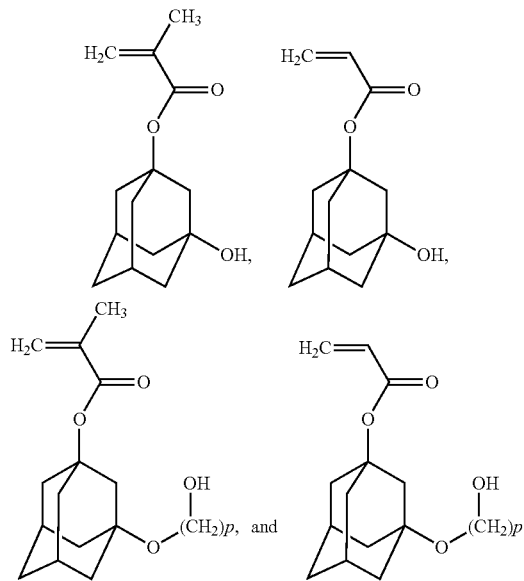

wherein p represents a positive integer from 1 to 30.

5. The BARC composition of claim 1, wherein the hydroxy-containing acyclic moiety is a monomer unit derived from a monomer selected from the group consisting of the following structures:

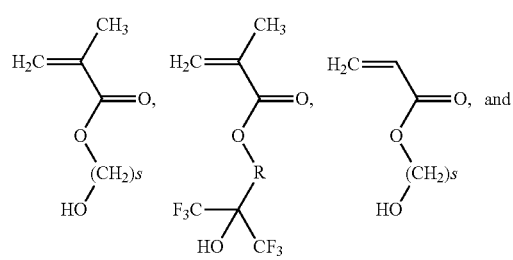

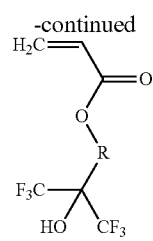

wherein s represents a positive integer from 1 to 30; R is a saturated carbon chain having a total number of carbon atoms from 1 to 30.

6. The BARC composition of claim 1, wherein the first chromophore moiety and the second chromophore moiety each includes an aromatic group.

7. The BARC composition of claim 6, wherein the first chromophore moiety and the second chromophore moiety each independently is a monomer unit derived from a monomer selected from the group consisting of the following structures:

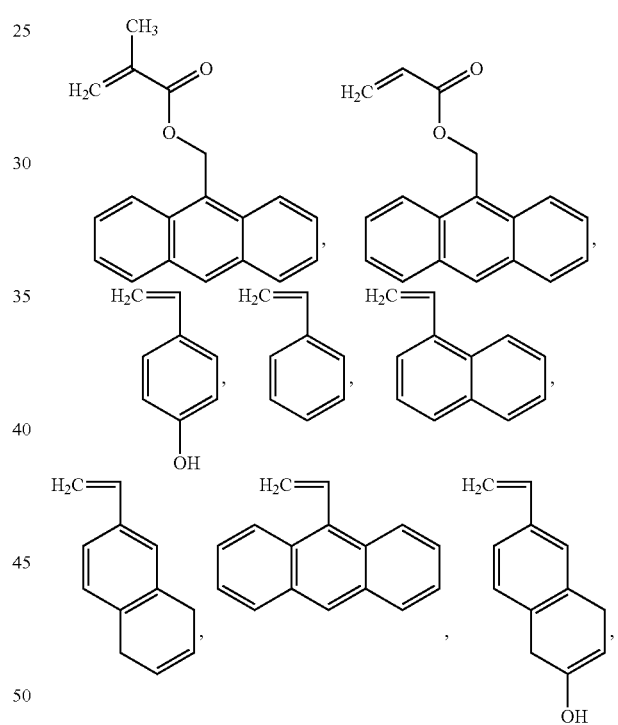

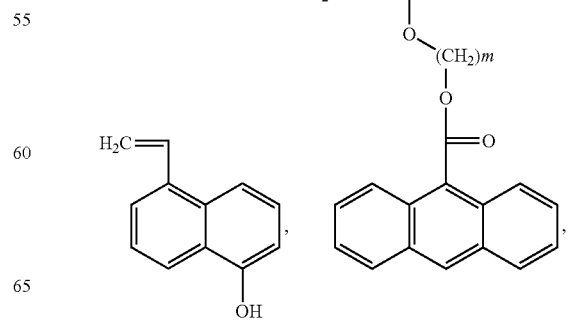

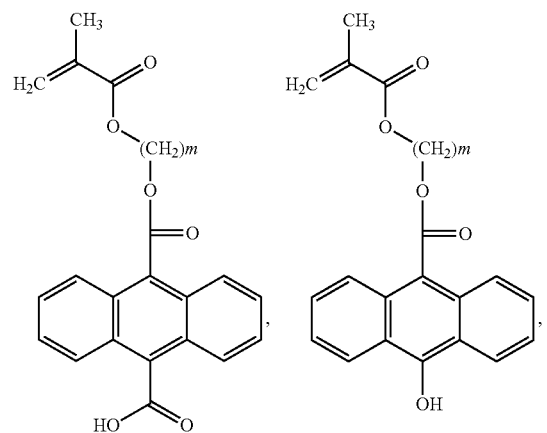
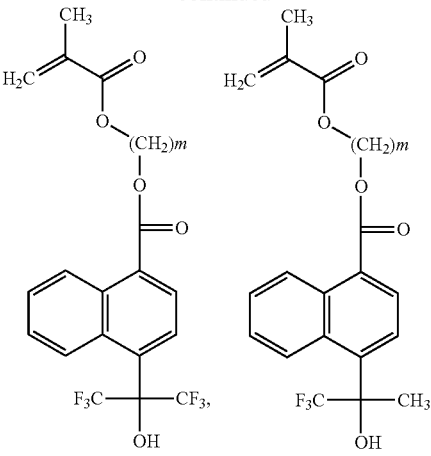
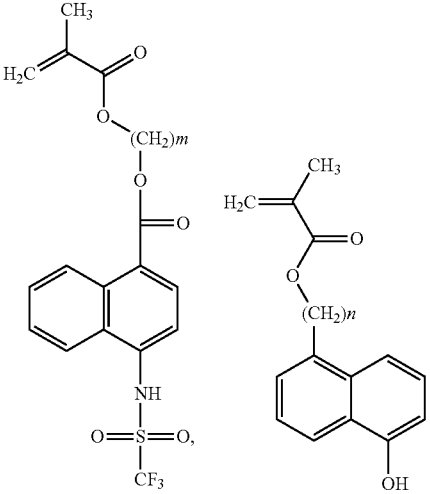
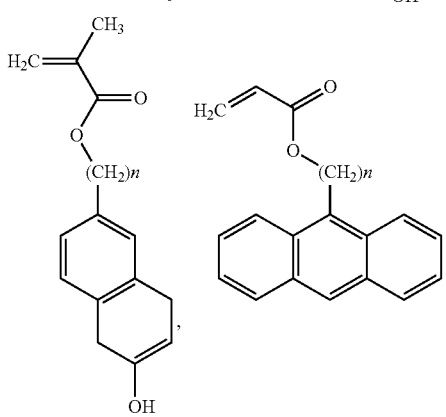
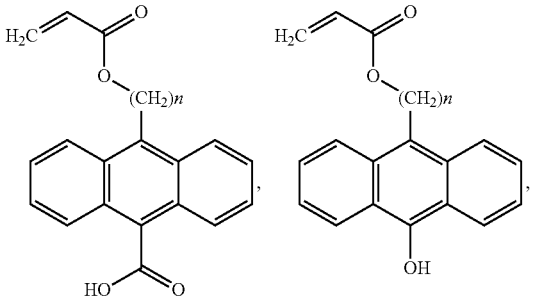

-continued

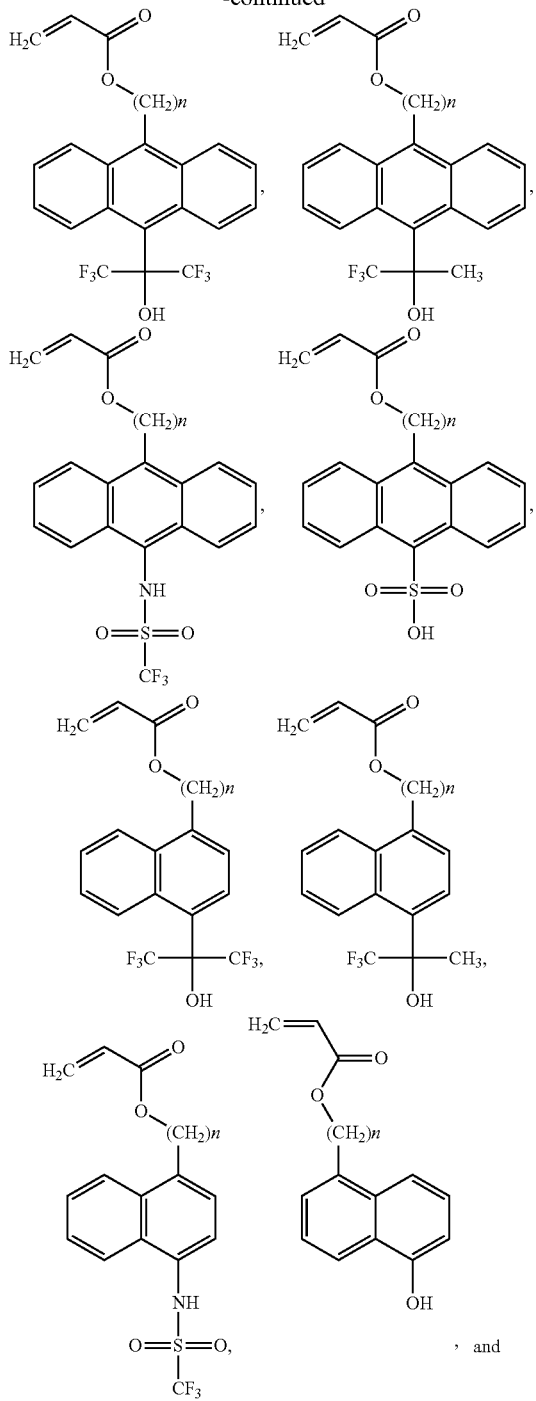

-continued

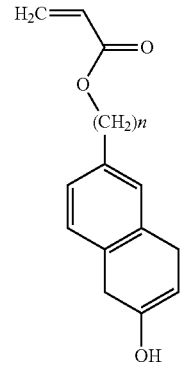

wherein m represents a positive integer from 1 to 30; n represents an integer from 0 to 30.

8. The BARC composition of claim 1, wherein the crosslinking agent is a glycoluril compound.

9. The BARC composition of claim 1, wherein the radiation sensitive acid generator comprises at least one of an onium salt, a succinimide derivative, a diazo compound, and a nitrobenzyl compound.

10. The BARC composition of claim 1, further comprising at least one of a solvent, a quencher, and a surfactant.

11. The BARC composition of claim 10, wherein the solvent comprises at least one of an ether, an alcohol, a glycol ether, an aromatic hydrocarbon, a ketone, and an ester.

12. The BARC composition of claim 11, wherein the BARC composition comprises:

about 0.1 to about 29 wt. % of the first polymer;

about 0.1 to about 29 wt. % of the second polymer;

about 0.1 to about 30 wt. % of the crosslinking agent, based on the total weight of the first and second polymers;

about 0.1 to about 30 wt. % of the radiation sensitive acid generator, based on the total weight of the first and second polymers; and about 70 to about 99.9 wt. % of the solvent.

13. The BARC composition of claim 12, wherein the weight percentage of the first polymer is higher than the weight percentage of the second polymer.

* * * * *